(12) United States Patent
Zhou et al.

(10) Patent No.: US 12,113,481 B2
(45) Date of Patent: Oct. 8, 2024

(54) SWITCH CIRCUIT, MIXER, AND ELECTRONIC DEVICE

(71) Applicant: Huawei Technologies Co., Ltd., Shenzhen (CN)

(72) Inventors: Yongli Zhou, Shanghai (CN); Xiangju Jin, Shenzhen (CN); Yan Lai, Suzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 432 days.

(21) Appl. No.: 17/514,564

(22) Filed: Oct. 29, 2021

(65) Prior Publication Data

US 2022/0052645 A1  Feb. 17, 2022

Related U.S. Application Data

(63) Continuation of application No. PCT/CN2019/085335, filed on Apr. 30, 2019.

(51) Int. Cl.
*H03D 7/14* (2006.01)
*H01L 21/52* (2006.01)
(Continued)

(52) U.S. Cl.
CPC .......... *H03D 7/1441* (2013.01); *H01L 21/52* (2013.01); *H01L 27/0207* (2013.01);
(Continued)

(58) Field of Classification Search
CPC .. H03D 7/1441; H03D 7/1458; H03D 7/1491; H03D 2200/008; H01L 27/0207
See application file for complete search history.

(56) References Cited

U.S. PATENT DOCUMENTS 5,060,298 A  10/1991  Waugh et al.
6,952,572 B2  10/2005  Wong et al.
(Continued)

FOREIGN PATENT DOCUMENTS

CN  104052418 A  9/2014
CN  203933551 U  * 11/2014
(Continued)

OTHER PUBLICATIONS

Zhao, Dixian, and Patrick Reynaert. "A 40 nm CMOS E-band transmitter with compact and symmetrical layout floor-plans." IEEE Journal of Solid-State Circuits 50.11 (2015): 2560-2571. (Year: 2015).*

*Primary Examiner* — Ryan Johnson
(74) *Attorney, Agent, or Firm* — Conley Rose, P.C.

(57) ABSTRACT

A switch circuit, a mixer, and an electronic device, where the switch circuit includes a first metal oxide semiconductor (MOS) transistor, a second MOS transistor, a third MOS transistor, and a fourth MOS transistor, both a gate of the first MOS transistor and a gate of the fourth MOS transistor are connected to a first port, and both a gate of the second MOS transistor and a gate of the third MOS transistor are connected to a second port; and a lead between the gate of the first MOS transistor and the first port, a lead between the gate of the second MOS transistor and the second port, a lead between the gate of the third MOS transistor and the second port, and a lead between the gate of the fourth MOS transistor and the first port all have an equal length. In this way, linearity is relatively high.

20 Claims, 8 Drawing Sheets

(51) Int. Cl.
*H01L 27/02* (2006.01)
*H01L 27/105* (2023.01)

(52) U.S. Cl.
CPC ......... *H01L 27/105* (2013.01); *H03D 7/1458* (2013.01); *H03D 7/1466* (2013.01); *H03D 7/1491* (2013.01); *H03D 2200/0088* (2013.01)

(56) References Cited

U.S. PATENT DOCUMENTS

| | | | |
|---|---|---|---|
| 2002/0135045 A1 | 9/2002 | Ito et al. | |
| 2005/0266821 A1 | 12/2005 | Dornbusch | |
| 2014/0029323 A1* | 1/2014 | Makita | H02M 7/5387 363/132 |
| 2014/0226759 A1* | 8/2014 | Han | H03D 7/1491 375/317 |
| 2020/0195231 A1* | 6/2020 | Liang | H03F 3/193 |

FOREIGN PATENT DOCUMENTS

| | | | |
|---|---|---|---|
| CN | 104348419 A | | 2/2015 |
| KR | 20020086052 A | * | 11/2002 |

* cited by examiner

SWITCH CIRCUIT, MIXER, AND ELECTRONIC DEVICE

CROSS-REFERENCE TO RELATED APPLICATIONS

This application is a continuation of International Patent Application No. PCT/CN2019/085335, filed on Apr. 30, 2019, the disclosure of which is hereby incorporated by reference in its entirety.

TECHNICAL FIELD

This application relates to the field of electronic technologies, and in particular, to a switch circuit, a mixer, and an electronic device.

BACKGROUND

In an electronic communications system, a mixer is a core circuit responsible for a spectrum shift function in a transceiver, and is widely used in a microwave wireless communications system, a radar system, and a measurement system. Technical indicators of the mixer mainly include an intermediate frequency/radio frequency band, a frequency conversion gain, a noise factor, linearity, isolation between ports, a port standing wave ratio, power consumption, and the like.

The mixer is located at a position with relatively high radio frequency signal amplitude in a receiver, and many interfering signals are not effectively suppressed. Therefore, linearity is a very important (even the most important) indicator. An input second-order intercept point (IIP2) is one of important indicators for measuring linearity of the mixer. The IIP2 is a measure of linearity that quantizes second-order distortion generated by nonlinearity of circuits (for example, an amplifier and a mixer). Currently, linearity of the mixer is relatively poor, and a mixer with better linearity needs to be studied.

SUMMARY

Embodiments of this application provide a switch circuit, a mixer, and an electronic device, to improve linearity of components.

According to a first aspect, an embodiment of this application provides a switch circuit. The switch circuit includes a first metal oxide semiconductor (MOS) transistor, a second MOS transistor, a third MOS transistor, and a fourth MOS transistor, both a gate of the first MOS transistor and a gate of the fourth MOS transistor are connected to a first port, and both a gate of the second MOS transistor and a gate of the third MOS transistor are connected to a second port; and a lead between the gate of the first MOS transistor and the first port, a lead between the gate of the second MOS transistor and the second port, a lead between the gate of the third MOS transistor and the second port, and a lead between the gate of the fourth MOS transistor and the first port all have an equal length.

In this embodiment of this application, traces of gates of all MOS transistors in the switch circuit have a same length, such that all the MOS transistors have a same gate parasitic capacitance. In this way, linearity is relatively high.

In an optional implementation, a first lead between the gate of the first MOS transistor and the gate of the fourth MOS transistor passes through a first position, a second lead between the gate of the second MOS transistor and the gate of the third MOS transistor passes through a second position, and the first position and the second position are same positions at different layers in the switch circuit; and a lead from the gate of the first MOS transistor to the first position, a lead from the gate of the second MOS transistor to the second position, a lead from the gate of the third MOS transistor to the second position, and a lead from the gate of the fourth MOS transistor to the first position have an equal length.

In this implementation, leads from the gates of all the MOS transistors in the switch circuit to same positions at different layers in the switch circuit have an equal length, such that all the MOS transistors have a same gate parasitic capacitance. In this way, linearity is relatively high.

In an optional implementation, the first MOS transistor and the third MOS transistor are aligned left and right and are symmetrical along a first symmetry axis, the second MOS transistor and the fourth MOS transistor are aligned left and right and are symmetrical along the first symmetry axis, the first MOS transistor and the second MOS transistor are aligned forward and backward and are symmetrical along a second symmetry axis, and the third MOS transistor and the fourth MOS transistor are aligned forward and backward and are symmetrical along the second symmetry axis. Additionally, the first symmetry axis and the second symmetry axis are perpendicular to each other.

In this implementation, all the MOS transistors in the switch circuit are symmetrically arranged, such that parasitic capacitances of all the MOS transistors are compatible. This improves linearity of the mixer.

In an optional implementation, one end of a third lead is connected to a third position of the first lead, and the other end of the third lead is connected to the first port; one end of a fourth lead is connected to a fourth position of the second lead, and the other end of the fourth lead is connected to the second port; the third position and the fourth position are symmetrical along the first symmetry axis; and the switch circuit is symmetrical along the first symmetry axis.

In this implementation, the third lead and the fourth lead are symmetrical along the first symmetry axis, such that the traces of the gates of all the MOS transistors may be symmetrical.

In an optional implementation, the gate of the first MOS transistor and the gate of the fourth MOS transistor are directly connected to form the first lead, the gate of the second MOS transistor and the gate of the third MOS transistor are directly connected to form the second lead, and both the first lead and the second lead are straight lines.

In this implementation, the gate of the first MOS transistor and the gate of the fourth MOS transistor are directly connected, and the gate of the second MOS transistor and the gate of the third MOS transistor are directly connected. This can effectively reduce lengths of leads. Therefore, costs are relatively low.

In an optional implementation, a part of the third lead is located on one side of the first symmetry axis, and the other part of the third lead is located on the other side of the first symmetry axis; a part of the fourth lead is located on one side of the first symmetry axis, and the other part of the fourth lead is located on the other side of the first symmetry axis; and the third lead passes through a fifth position, the fourth lead passes through a sixth position, and the fifth position and the sixth position are same positions at different layers in the switch circuit.

In this implementation, the traces of the gates of all the MOS transistors are strictly symmetrical, such that gate parasitic capacitances of all the MOS transistors are consistent.

In an optional implementation, a first part of the third lead and a part of the second lead are located in same positions at different layers in the switch circuit, a second part of the third lead is parallel to the first symmetry axis, a third part of the third lead is located on two sides of the first symmetry axis, and a fourth part of the third lead is parallel to the first symmetry axis; a first part of the fourth lead and a part of the first lead are located in same positions at different layers in the switch circuit, a second part of the fourth lead is parallel to the first symmetry axis, a third part of the fourth lead is located on the two sides of the first symmetry axis, and a fourth part of the fourth lead is parallel to the first symmetry axis; and the third part of the third lead passes through the fifth position, and the third part of the fourth lead passes through the sixth position.

In this implementation, the first part of the third lead and a part of the second lead are located in same positions at different layers in the switch circuit, and the first part of the fourth lead and a part of the first lead are located in same positions at different layers in the switch circuit. This can effectively reduce mutual impact between leads.

In an optional implementation, the third lead is located on one side of the first symmetry axis, and the fourth lead is located on the other side of the first symmetry axis; a first part of the third lead and a part of the second lead are located in same positions at different layers in the switch circuit, and a second part of the third lead is parallel to the first symmetry axis; and a first part of the fourth lead and a part of the first lead are located in same positions at different layers in the switch circuit, and a second part of the fourth lead is parallel to the first symmetry axis.

In this implementation, the third lead and the fourth lead are not crossed but are directly connected to the first port and the second port respectively. In this way, routing is simple.

In an optional implementation, the third position and the first position are same positions, and the fourth position and the second position are same positions.

According to a second aspect, an embodiment of this application provides another switch circuit. The switch circuit includes a first MOS transistor, a second MOS transistor, a third MOS transistor, and a fourth MOS transistor, both a gate of the first MOS transistor and a gate of the fourth MOS transistor are connected to a first port, and both a gate of the second MOS transistor and a gate of the third MOS transistor are connected to a second port; and both a lead between the gate of the first MOS transistor and the gate of the fourth MOS transistor and a lead between the gate of the second MOS transistor and the gate of the third MOS transistor pass through same positions at different layers in the switch circuit.

In this embodiment of this application, both the lead between the gate of the first MOS transistor and the gate of the fourth MOS transistor and the lead between the gate of the second MOS transistor and the gate of the third MOS transistor pass through same positions at different layers in the switch circuit. This can improve linearity of the switch circuit.

In an optional implementation, a lead between the gate of the first MOS transistor and the first port, a lead between the gate of the second MOS transistor and the second port, a lead between the gate of the third MOS transistor and the second port, and a lead between the gate of the fourth MOS transistor and the first port all have an equal length.

In this implementation, traces of gates of all MOS transistors in the switch circuit have a same length, such that all the MOS transistors have a same gate parasitic capacitance. In this way, linearity is relatively high.

In an optional implementation, a first lead between the gate of the first MOS transistor and the gate of the fourth MOS transistor passes through a first position, a second lead between the gate of the second MOS transistor and the gate of the third MOS transistor passes through a second position, and the first position and the second position are same positions at different layers in the switch circuit; and a lead from the gate of the first MOS transistor to the first position, a lead from the gate of the second MOS transistor to the second position, a lead from the gate of the third MOS transistor to the second position, and a lead from the gate of the fourth MOS transistor to the first position have an equal length.

In this implementation, leads from the gates of all the MOS transistors in the switch circuit to same positions at different layers in the switch circuit have an equal length, such that all the MOS transistors have a same gate parasitic capacitance. In this way, linearity is relatively high.

In an optional implementation, the first MOS transistor and the third MOS transistor are aligned left and right and are symmetrical along a first symmetry axis, the second MOS transistor and the fourth MOS transistor are aligned left and right and are symmetrical along the first symmetry axis, the first MOS transistor and the second MOS transistor are aligned forward and backward and are symmetrical along a second symmetry axis, and the third MOS transistor and the fourth MOS transistor are aligned forward and backward and are symmetrical along the second symmetry axis; and the first symmetry axis and the second symmetry axis are perpendicular to each other.

In this implementation, all the MOS transistors in the switch circuit are symmetrically arranged, such that parasitic capacitances of all the MOS transistors are compatible. This improves linearity of a mixer.

In an optional implementation, one end of a third lead is connected to a third position of the first lead, and the other end of the third lead is connected to the first port; one end of a fourth lead is connected to a fourth position of the second lead, and the other end of the fourth lead is connected to the second port; the third position and the fourth position are symmetrical along the first symmetry axis; and the switch circuit is symmetrical along the first symmetry axis.

In this implementation, the third lead and the fourth lead are symmetrical along the first symmetry axis, such that the traces of the gates of all the MOS transistors may be symmetrical.

In an optional implementation, the gate of the first MOS transistor and the gate of the fourth MOS transistor are directly connected to form the first lead, the gate of the second MOS transistor and the gate of the third MOS transistor are directly connected to form the second lead, and both the first lead and the second lead are straight lines.

In this implementation, the gate of the first MOS transistor and the gate of the fourth MOS transistor are directly connected, and the gate of the second MOS transistor and the gate of the third MOS transistor are directly connected. This can effectively reduce lengths of leads.

In an optional implementation, a part of the third lead is located on one side of the first symmetry axis, and the other part of the third lead is located on the other side of the first symmetry axis; a part of the fourth lead is located on one side of the first symmetry axis, and the other part of the fourth lead is located on the other side of the first symmetry axis; and the third lead passes through a fifth position, the fourth lead passes through a sixth position, and the fifth position and the sixth position are same positions at different layers in the switch circuit.

In this implementation, the traces of the gates of all the MOS transistors are strictly symmetrical, such that gate parasitic capacitances of all the MOS transistors are consistent.

In an optional implementation, a first part of the third lead and a part of the second lead are located in same positions at different layers in the switch circuit, a second part of the third lead is parallel to the first symmetry axis, a third part of the third lead is located on two sides of the first symmetry axis, and a fourth part of the third lead is parallel to the first symmetry axis; a first part of the fourth lead and a part of the first lead are located in same positions at different layers in the switch circuit, a second part of the fourth lead is parallel to the first symmetry axis, a third part of the fourth lead is located on the two sides of the first symmetry axis, and a fourth part of the fourth lead is parallel to the first symmetry axis; and the third part of the third lead passes through the fifth position, and the third part of the fourth lead passes through the sixth position.

In this implementation, the first part of the third lead and a part of the second lead are located in same positions at different layers in the switch circuit, and the first part of the fourth lead and a part of the first lead are located in same positions at different layers in the switch circuit. This can effectively reduce mutual impact between leads.

In an optional implementation, the third lead is located on one side of the first symmetry axis, and the fourth lead is located on the other side of the first symmetry axis; a first part of the third lead and a part of the second lead are located in same positions at different layers in the switch circuit, and a second part of the third lead is parallel to the first symmetry axis; and a first part of the fourth lead and a part of the first lead are located in same positions at different layers in the switch circuit, and a second part of the fourth lead is parallel to the first symmetry axis.

In this implementation, the third lead and the fourth lead are not crossed but are directly connected to the first port and the second port respectively. In this way, routing is simple.

In an optional implementation, the third position and the first position are same positions, and the fourth position and the second position are same positions.

According to a third aspect, an embodiment of this application provides a mixer. The mixer includes a first MOS transistor group; the first MOS transistor group includes a first MOS transistor, a second MOS transistor, a third MOS transistor, and a fourth MOS transistor, both a gate of the first MOS transistor and a gate of the fourth MOS transistor are connected to a first local oscillator port, and both a gate of the second MOS transistor and a gate of the third MOS transistor are connected to a second local oscillator port; and a lead between the gate of the first MOS transistor and the first local oscillator port, a lead between the gate of the second MOS transistor and the second local oscillator port, a lead between the gate of the third MOS transistor and the second local oscillator port, and a lead between the gate of the fourth MOS transistor and the first local oscillator port all have an equal length.

In this embodiment of this application, traces of gates of all MOS transistors in the mixer have a same length, such that all the MOS transistors have a same gate parasitic capacitance. In this way, linearity is relatively high.

In an optional implementation, both the first local oscillator port and the second local oscillator port are local oscillator ports for receiving a drive voltage; both a source of the first MOS transistor and a source of the second MOS transistor are connected to a first input port, and both a source of the third MOS transistor and a source of the fourth MOS transistor are connected to a second input port; and both a drain of the first MOS transistor and a drain of the third MOS transistor are connected to a first output port, and both a drain of the second MOS transistor and a drain of the fourth MOS transistor are connected to a second output port.

In an optional implementation, a first lead between the gate of the first MOS transistor and the gate of the fourth MOS transistor passes through a first position, a second lead between the gate of the second MOS transistor and the gate of the third MOS transistor passes through a second position, and the first position and the second position are same positions at different layers in the mixer; and a lead from the gate of the first MOS transistor to the first position, a lead from the gate of the second MOS transistor to the second position, a lead from the gate of the third MOS transistor to the second position, and a lead from the gate of the fourth MOS transistor to the first position have an equal length.

In this implementation, leads from the gates of all the MOS transistors in the mixer to same positions at different layers in the mixer have an equal length, such that all the MOS transistors have a same gate parasitic capacitance. In this way, linearity is relatively high.

In an optional implementation, the first MOS transistor and the third MOS transistor are aligned left and right and are symmetrical along a first symmetry axis, the second MOS transistor and the fourth MOS transistor are aligned left and right and are symmetrical along the first symmetry axis, the first MOS transistor and the second MOS transistor are aligned forward and backward and are symmetrical along a second symmetry axis, and the third MOS transistor and the fourth MOS transistor are aligned forward and backward and are symmetrical along the second symmetry axis; and the first symmetry axis and the second symmetry axis are perpendicular to each other.

In this implementation, all the MOS transistors in the mixer are symmetrically arranged, such that parasitic capacitances of all the MOS transistors are compatible. This improves linearity of the mixer.

In an optional implementation, one end of a third lead is connected to a third position of the first lead, and the other end of the third lead is connected to the first local oscillator port; one end of a fourth lead is connected to a fourth position of the second lead, and the other end of the fourth lead is connected to the second local oscillator port; the third position and the fourth position are symmetrical along the first symmetry axis; and the mixer is symmetrical along the first symmetry axis.

In this implementation, the third lead and the fourth lead are symmetrical along the first symmetry axis, such that the traces of the gates of all the MOS transistors may be symmetrical.

In an optional implementation, the gate of the first MOS transistor and the gate of the fourth MOS transistor are directly connected to form the first lead, the gate of the second MOS transistor and the gate of the third MOS transistor are directly connected to form the second lead, and both the first lead and the second lead are straight lines.

In this implementation, the gate of the first MOS transistor and the gate of the fourth MOS transistor are directly connected, and the gate of the second MOS transistor and the gate of the third MOS transistor are directly connected. This can effectively reduce lengths of leads.

In an optional implementation, a part of the third lead is located on one side of the first symmetry axis, and the other part of the third lead is located on the other side of the first symmetry axis; a part of the fourth lead is located on one side of the first symmetry axis, and the other part of the fourth lead is located on the other side of the first symmetry axis; and the third lead passes through a fifth position, the fourth lead passes through a sixth position, and the fifth position and the sixth position are same positions at different layers in the mixer.

In this implementation, the traces of the gates of all the MOS transistors are strictly symmetrical, such that both gate resistances and gate parasitic capacitances of all the MOS transistors are consistent.

In an optional implementation, a first part of the third lead and a part of the second lead are located in same positions at different layers in the mixer, a second part of the third lead is parallel to the first symmetry axis, a third part of the third lead is located on two sides of the first symmetry axis, and a fourth part of the third lead is parallel to the first symmetry axis; a first part of the fourth lead and a part of the first lead are located in same positions at different layers in the mixer, a second part of the fourth lead is parallel to the first symmetry axis, a third part of the fourth lead is located on the two sides of the first symmetry axis, and a fourth part of the fourth lead is parallel to the first symmetry axis; and the third part of the third lead passes through the fifth position, and the third part of the fourth lead passes through the sixth position.

In this implementation, the first part of the third lead and a part of the second lead are located in same positions at different layers in the mixer, and the first part of the fourth lead and a part of the first lead are located in same positions at different layers in the mixer. This can effectively reduce mutual impact between leads.

In an optional implementation, the third lead is located on one side of the first symmetry axis, and the fourth lead is located on the other side of the first symmetry axis; a first part of the third lead and a part of the second lead are located in same positions at different layers in the mixer, and a second part of the third lead is parallel to the first symmetry axis; and a first part of the fourth lead and a part of the first lead are located in same positions at different layers in the mixer, and a second part of the fourth lead is parallel to the first symmetry axis.

In this implementation, the third lead and the fourth lead are not crossed but are directly connected to the first local oscillator port and the second local oscillator port respectively. In this way, routing is simple.

In an optional implementation, the third position and the first position are same positions, and the fourth position and the second position are same positions.

In this implementation, it can be ensured that the traces of the gates of all the MOS transistors are strictly symmetrical.

In an optional implementation, both the first input port and the second input port are connected to a low noise amplifier, and both the first output port and the second output port are connected to a transimpedance amplifier.

According to a fourth aspect, an embodiment of this application provides another mixer. The mixer includes a first MOS transistor group and a second MOS transistor group; the first MOS transistor group includes a first MOS transistor, a second MOS transistor, a third MOS transistor, and a fourth MOS transistor, both a gate of the first MOS transistor and a gate of the fourth MOS transistor are connected to a first local oscillator port, and both a gate of the second MOS transistor and a gate of the third MOS transistor are connected to a second local oscillator port; and a lead between the gate of the first MOS transistor and the first local oscillator port, a lead between the gate of the second MOS transistor and the second local oscillator port, a lead between the gate of the third MOS transistor and the second local oscillator port, and a lead between the gate of the fourth MOS transistor and the first local oscillator port all have an equal length.

In this embodiment of this application, traces of gates of all MOS transistors in the mixer have a same length. As such, all the MOS transistors have a same gate parasitic capacitance. In this way, linearity is relatively high.

In an optional implementation, the first MOS transistor group and the second MOS transistor group are aligned left and right and are symmetrical along a reference symmetry axis.

In this implementation, the first MOS transistor group and the second MOS transistor group are symmetrically disposed. As such, parasitic capacitances of the two MOS transistor groups may be consistent. This improves linearity of the mixer.

In an optional implementation, a first lead between the gate of the first MOS transistor and the gate of the fourth MOS transistor passes through a first position, a second lead between the gate of the second MOS transistor and the gate of the third MOS transistor passes through a second position, and the first position and the second position are same positions at different layers in the mixer; and a lead from the gate of the first MOS transistor to the first position, a lead from the gate of the second MOS transistor to the second position, a lead from the gate of the third MOS transistor to the second position, and a lead from the gate of the fourth MOS transistor to the first position have an equal length.

In this implementation, leads from the gates of all the MOS transistors in the mixer to same positions at different layers in the mixer have an equal length. As such, all the MOS transistors have a same gate parasitic capacitance. In this way, linearity is relatively high.

In an optional implementation, the first MOS transistor and the third MOS transistor are aligned left and right and are symmetrical along a first symmetry axis, the second MOS transistor and the fourth MOS transistor are aligned left and right and are symmetrical along the first symmetry axis, the first MOS transistor and the second MOS transistor are aligned forward and backward and are symmetrical along a second symmetry axis, and the third MOS transistor and the fourth MOS transistor are aligned forward and backward and are symmetrical along the second symmetry axis; and the first symmetry axis and the second symmetry axis are perpendicular to each other.

In this implementation, all the MOS transistors in the mixer are symmetrically arranged. As such, parasitic capacitances of all the MOS transistors are compatible. This improves linearity of the mixer.

In an optional implementation, one end of a third lead is connected to a third position of the first lead, and the other end of the third lead is connected to the first port; one end of a fourth lead is connected to a fourth position of the second lead, and the other end of the fourth lead is connected to the second port; the third position and the fourth position are symmetrical along the first symmetry axis; and the mixer is symmetrical along the first symmetry axis.

In this implementation, the third lead and the fourth lead are symmetrical along the first symmetry axis. As such, the traces of the gates of all the MOS transistors may be symmetrical.

In an optional implementation, the gate of the first MOS transistor and the gate of the fourth MOS transistor are directly connected to form the first lead, the gate of the second MOS transistor and the gate of the third MOS transistor are directly connected to form the second lead, and both the first lead and the second lead are straight lines.

In this implementation, the gate of the first MOS transistor and the gate of the fourth MOS transistor are directly connected, and the gate of the second MOS transistor and the gate of the third MOS transistor are directly connected. This can effectively reduce lengths of leads.

In an optional implementation, a part of the third lead is located on one side of the first symmetry axis, and the other part of the third lead is located on the other side of the first symmetry axis; a part of the fourth lead is located on one side of the first symmetry axis, and the other part of the fourth lead is located on the other side of the first symmetry axis; and the third lead passes through a fifth position, the fourth lead passes through a sixth position, and the fifth position and the sixth position are same positions at different layers in the mixer.

In this implementation, the traces of the gates of all the MOS transistors are strictly symmetrical. As such, both gate resistances and gate parasitic capacitances of all the MOS transistors are consistent.

In an optional implementation, a first part of the third lead and a part of the second lead are located in same positions at different layers in the mixer, a second part of the third lead is parallel to the first symmetry axis, a third part of the third lead is located on two sides of the first symmetry axis, and a fourth part of the third lead is parallel to the first symmetry axis; a first part of the fourth lead and a part of the first lead are located in same positions at different layers in the mixer, a second part of the fourth lead is parallel to the first symmetry axis, a third part of the fourth lead is located on the two sides of the first symmetry axis, and a fourth part of the fourth lead is parallel to the first symmetry axis; and the third part of the third lead passes through the fifth position, and the third part of the fourth lead passes through the sixth position.

In this implementation, the first part of the third lead and a part of the second lead are located in same positions at different layers in the mixer, and the first part of the fourth lead and a part of the first lead are located in same positions at different layers in the mixer. This can effectively reduce mutual impact between leads.

In an optional implementation, the third lead is located on one side of the first symmetry axis, and the fourth lead is located on the other side of the first symmetry axis; a first part of the third lead and a part of the second lead are located in same positions at different layers in the mixer, and a second part of the third lead is parallel to the first symmetry axis; and a first part of the fourth lead and a part of the first lead are located in same positions at different layers in the mixer, and a second part of the fourth lead is parallel to the first symmetry axis.

In this implementation, the third lead and the fourth lead are not crossed but are directly connected to the first local oscillator port and the second local oscillator port respectively. In this way, routing is simple.

In an optional implementation, the third position and the first position are same positions, and the fourth position and the second position are same positions.

In this implementation, it can be ensured that the traces of the gates of all the MOS transistors are strictly symmetrical.

In an optional implementation, the first MOS transistor group and the second MOS transistor group are disposed on different deep N-wells (DNWs).

In this implementation, isolation between the first MOS transistor group and the second MOS transistor group is relatively high.

In an optional implementation, both the first input port and the second input port are connected to a low noise amplifier, and both the first output port and the second output port are connected to a transimpedance amplifier.

According to a fifth aspect, an embodiment of this application provides still another mixer. The mixer includes a first MOS transistor group and a second MOS transistor group, where the first MOS transistor group and the second MOS transistor group are disposed on different deep N-wells.

Optionally, a circuit structure of the second MOS transistor group is the same as a circuit structure of the first MOS transistor group.

In this embodiment of this application, the two MOS transistor groups are disposed on different deep N-wells, such that isolation between the two MOS transistor groups can be improved.

In an optional implementation, the first MOS transistor group includes a first MOS transistor, a second MOS transistor, a third MOS transistor, and a fourth MOS transistor, both a gate of the first MOS transistor and a gate of the fourth MOS transistor are connected to a first port, and both a gate of the second MOS transistor and a gate of the third MOS transistor are connected to a second port; and a lead between the gate of the first MOS transistor and the first port, a lead between the gate of the second MOS transistor and the second port, a lead between the gate of the third MOS transistor and the second port, and a lead between the gate of the fourth MOS transistor and the first port all have an equal length.

In this implementation, traces of gates of all MOS transistors in the mixer have a same length, such that all the MOS transistors have a same gate parasitic capacitance. In this way, linearity is relatively high.

In an optional implementation, the first MOS transistor group and the second MOS transistor group are aligned left and right and are symmetrical along a reference symmetry axis.

In this implementation, the first MOS transistor group and the second MOS transistor group are symmetrically disposed, such that parasitic capacitances of the two MOS transistor groups may be consistent. This improves linearity of the mixer.

In an optional implementation, a first lead between the gate of the first MOS transistor and the gate of the fourth MOS transistor passes through a first position, a second lead between the gate of the second MOS transistor and the gate of the third MOS transistor passes through a second position, and the first position and the second position are same positions at different layers in the mixer; and a lead from the gate of the first MOS transistor to the first position, a lead from the gate of the second MOS transistor to the second position, a lead from the gate of the third MOS transistor to the second position, and a lead from the gate of the fourth MOS transistor to the first position have an equal length.

In this implementation, leads from the gates of all the MOS transistors in the mixer to same positions at different layers in the mixer have an equal length, such that all the MOS transistors have a same gate parasitic capacitance. In this way, linearity is relatively high.

In an optional implementation, the first MOS transistor and the third MOS transistor are aligned left and right and are symmetrical along a first symmetry axis, the second MOS transistor and the fourth MOS transistor are aligned left and right and are symmetrical along the first symmetry axis, the first MOS transistor and the second MOS transistor are aligned forward and backward and are symmetrical along a second symmetry axis, and the third MOS transistor and the fourth MOS transistor are aligned forward and backward and are symmetrical along the second symmetry axis; and the first symmetry axis and the second symmetry axis are perpendicular to each other.

In this implementation, all the MOS transistors in the mixer are symmetrically arranged, such that parasitic capacitances of all the MOS transistors are compatible. This improves linearity of the mixer.

In an optional implementation, one end of a third lead is connected to a third position of the first lead, and the other end of the third lead is connected to the first port; one end of a fourth lead is connected to a fourth position of the second lead, and the other end of the fourth lead is connected to the second port; the third position and the fourth position are symmetrical along the first symmetry axis; and the mixer is symmetrical along the first symmetry axis.

In this implementation, the third lead and the fourth lead are symmetrical along the first symmetry axis, such that the traces of the gates of all the MOS transistors may be symmetrical.

In an optional implementation, the gate of the first MOS transistor and the gate of the fourth MOS transistor are directly connected to form the first lead, the gate of the second MOS transistor and the gate of the third MOS transistor are directly connected to form the second lead, and both the first lead and the second lead are straight lines.

In this implementation, the gate of the first MOS transistor and the gate of the fourth MOS transistor are directly connected, and the gate of the second MOS transistor and the gate of the third MOS transistor are directly connected. This can effectively reduce lengths of leads.

In an optional implementation, a part of the third lead is located on one side of the first symmetry axis, and the other part of the third lead is located on the other side of the first symmetry axis; a part of the fourth lead is located on one side of the first symmetry axis, and the other part of the fourth lead is located on the other side of the first symmetry axis; and the third lead passes through a fifth position, the fourth lead passes through a sixth position, and the fifth position and the sixth position are same positions at different layers in the mixer.

In this implementation, the traces of the gates of all the MOS transistors are strictly symmetrical, such that both gate resistances and gate parasitic capacitances of all the MOS transistors are consistent.

In an optional implementation, a first part of the third lead and a part of the second lead are located in same positions at different layers in the mixer, a second part of the third lead is parallel to the first symmetry axis, a third part of the third lead is located on two sides of the first symmetry axis, and a fourth part of the third lead is parallel to the first symmetry axis; a first part of the fourth lead and a part of the first lead are located in same positions at different layers in the mixer, a second part of the fourth lead is parallel to the first symmetry axis, a third part of the fourth lead is located on the two sides of the first symmetry axis, and a fourth part of the fourth lead is parallel to the first symmetry axis; and the third part of the third lead passes through the fifth position, and the third part of the fourth lead passes through the sixth position.

In this implementation, the first part of the third lead and a part of the second lead are located in same positions at different layers in the mixer, and the first part of the fourth lead and a part of the first lead are located in same positions at different layers in the mixer. This can effectively reduce mutual impact between leads.

In an optional implementation, the third lead is located on one side of the first symmetry axis, and the fourth lead is located on the other side of the first symmetry axis; a first part of the third lead and a part of the second lead are located in same positions at different layers in the mixer, and a second part of the third lead is parallel to the first symmetry axis; and a first part of the fourth lead and a part of the first lead are located in same positions at different layers in the mixer, and a second part of the fourth lead is parallel to the first symmetry axis.

In this implementation, the third lead and the fourth lead are not crossed but are directly connected to the first port and the second port respectively. In this way, routing is simple.

In an optional implementation, the third position and the first position are same positions, and the fourth position and the second position are same positions.

In this implementation, it can be ensured that the traces of the gates of all the MOS transistors are strictly symmetrical.

In an optional implementation, both a first input port and a second input port are connected to a low noise amplifier, and both a first output port and a second output port are connected to a transimpedance amplifier.

According to a sixth aspect, an embodiment of this application provides an electronic device, where the electronic device includes the mixer according to any one of the third aspect to the fifth aspect and the optional implementations.

The electronic device may be a receiver, a transceiver, or a radio frequency chip in a terminal (for example, a mobile phone or a base station), or may be a terminal, or may be another device.

DESCRIPTION OF EMBODIMENTS

To make a person skilled in the art better understand the technical solutions in this application, the following clearly describes the technical solutions in the embodiments of this application with reference to the accompanying drawings in the embodiments of this application. It is clear that the described embodiments are merely a part but not all of the embodiments of this application.

In the embodiments of the specification, the claims, and the accompanying drawings of this application, the terms "first", "second", "third", and the like are intended to distinguish between similar objects, but do not necessarily indicate a specific order or sequence. Moreover, the terms "include", "have", and any other variant thereof are intended to cover a non-exclusive inclusion, for example, including a series of steps or units. Methods, systems, products, or devices are not necessarily limited to those explicitly listed steps or units, but may include other steps or units that are not explicitly listed or that are inherent to such processes, methods, products, or devices.

Figure 1:
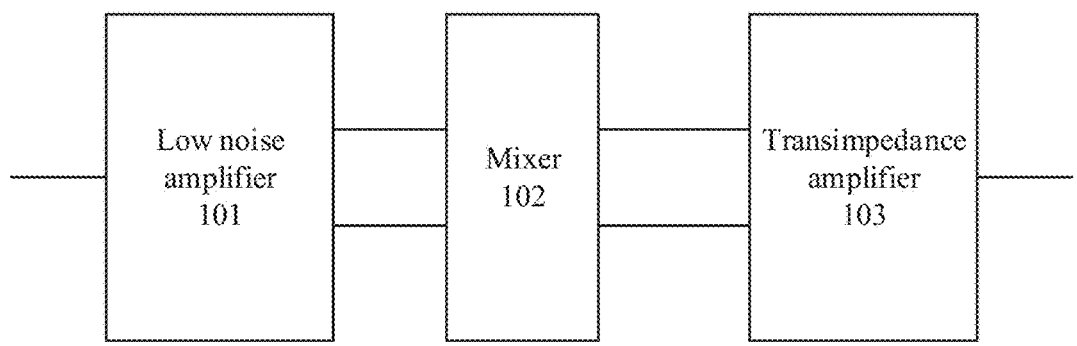
FIG. 1 is a schematic diagram of a position of a mixer in a receiver.

In an electronic communications system, a mixer is a core circuit responsible for a spectrum shift function in a transceiver, and is widely used in a microwave wireless communications system, a radar system, and a measurement system. A receiver basically includes components such as an amplifier, a filter, and a mixer. The components are used to amplify and filter an analog input signal, perform frequency shift or conversion for several times on the analog input signal that is amplified and filtered, then perform sampling using an analog-to-digital converter (ADC), and send a digital signal to a computer or digital signal processor for further processing. The mixer is located at a position with relatively high radio frequency signal amplitude in the receiver, and many interfering signals are not effectively suppressed. Therefore, linearity is a very important (even the most important) indicator of the mixer. FIG. 1 is a schematic diagram of a position of a mixer in a receiver. As shown in FIG. 1, 101 indicates a low noise amplifier, 102 indicates a mixer, and 103 indicates a transimpedance amplifier. The mixer 102 is located after the low noise amplifier 101, and the transimpedance amplifier 103 is located after the mixer 102. The low noise amplifier 101 performs low noise amplification processing on a received weak signal, to input a quadrature radio frequency signal to two input ends of the mixer 102. The mixer 102 mixes (that is, performs frequency shift on) the radio frequency signal at the input end of the mixer 102 and a local oscillator signal, to obtain an intermediate frequency signal. The transimpedance amplifier 103 converts the received intermediate frequency signal into a voltage signal. FIG. 1 shows merely an example provided in this application. The mixer may be used in a plurality of types of circuits. The position of the mixer is not limited in this application.

Figure 2:
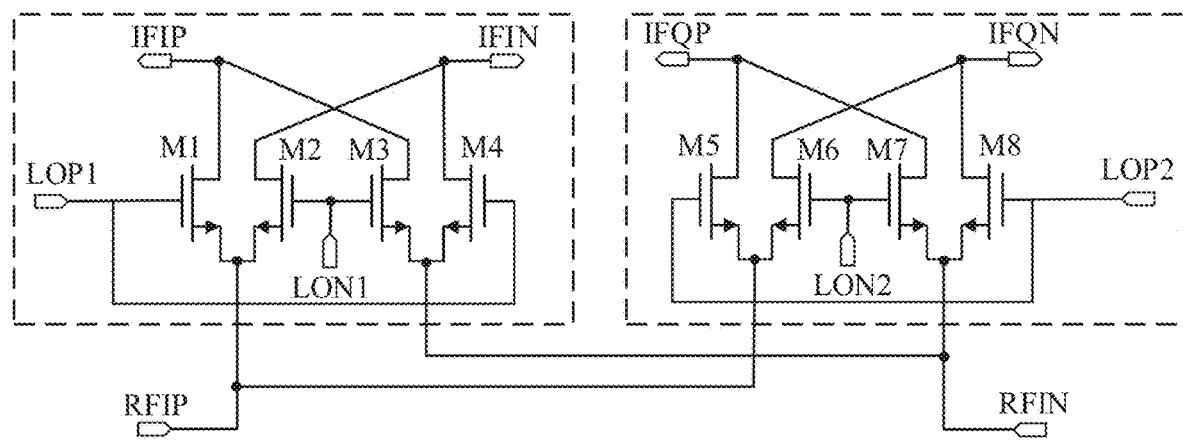
FIG. 2 is a diagram of a circuit principle of a mixer.

FIG. 2 is a diagram of a circuit principle of a mixer. As shown in FIG. 2, a dashed line box on the left indicates a first switch circuit, and a dashed line box on the right indicates a second switch circuit. The first switch circuit includes M1 to M4, where M1 to M4 all indicate metal oxide semiconductor (MOS) transistors. Both a gate of M1 and a gate of M4 are connected to an input port LOP1, and both a gate of M2 and a gate of M3 are connected to an input port LON1. Both a source of M1 and a source of M2 are connected to an input port RFIP, and both a source of M3 and a source of M4 are connected to an input port RFIN. Output ports of the first switch circuit are IFIP and IFIN, where IFIP and IFIN refer to positive and negative intermediate frequency (IF) in-phase (I) ports, respectively. The second switch circuit includes M5 to M8, where M5 to M8 all indicate MOS transistors. Both a gate of M5 and a gate of M8 are connected to an input port LOP2, and both a gate of M6 and a gate of M7 are connected to an input port LON2. Both a source of M5 and a source of M6 are connected to the input port RFIP, and both a source of M7 and a source of M8 are connected to the input port RFIN. Output ports of the second switch circuit are IFQP and IFQN, where IFQP and IFQN refer to positive and negative IF quadrature (Q) ports, respectively. The first switch circuit and the second switch circuit are connected in parallel, and are both driven by a quadrature local oscillator signal to output two intermediate frequency signals I and Q. The first switch circuit and the second switch circuit constitute a quadrature Gilbert mixer. A signal input into the input port LOP1 and a signal input into the input port LON1 are quadrature signals, and a signal input into the input port LOP2 and a signal input into the input port LON2 are quadrature signals. FIG. 2 shows merely an example of the diagram of the circuit principle of the mixer according to this application. Diagrams of circuit principles of different types of mixers are different, and the diagram of the circuit principle of the mixer is not limited in this application. It can be learned from FIG. 2 that the mixer includes two groups of switch circuits having a same structure. Both the gate of M1 and the gate of M4 are connected to the input port LOP1, and both the gate of M2 and the gate of M3 are connected to the input port LON1. Both the gate of M5 and the gate of M8 are connected to the input port LOP2, and both the gate of M6 and the gate of M7 are connected to the input port LON2. The two groups of switch circuits are both driven by a quadrature local oscillator signal. One group outputs the intermediate frequency signal I, and the other group outputs the intermediate frequency signal Q.

Figure 3:
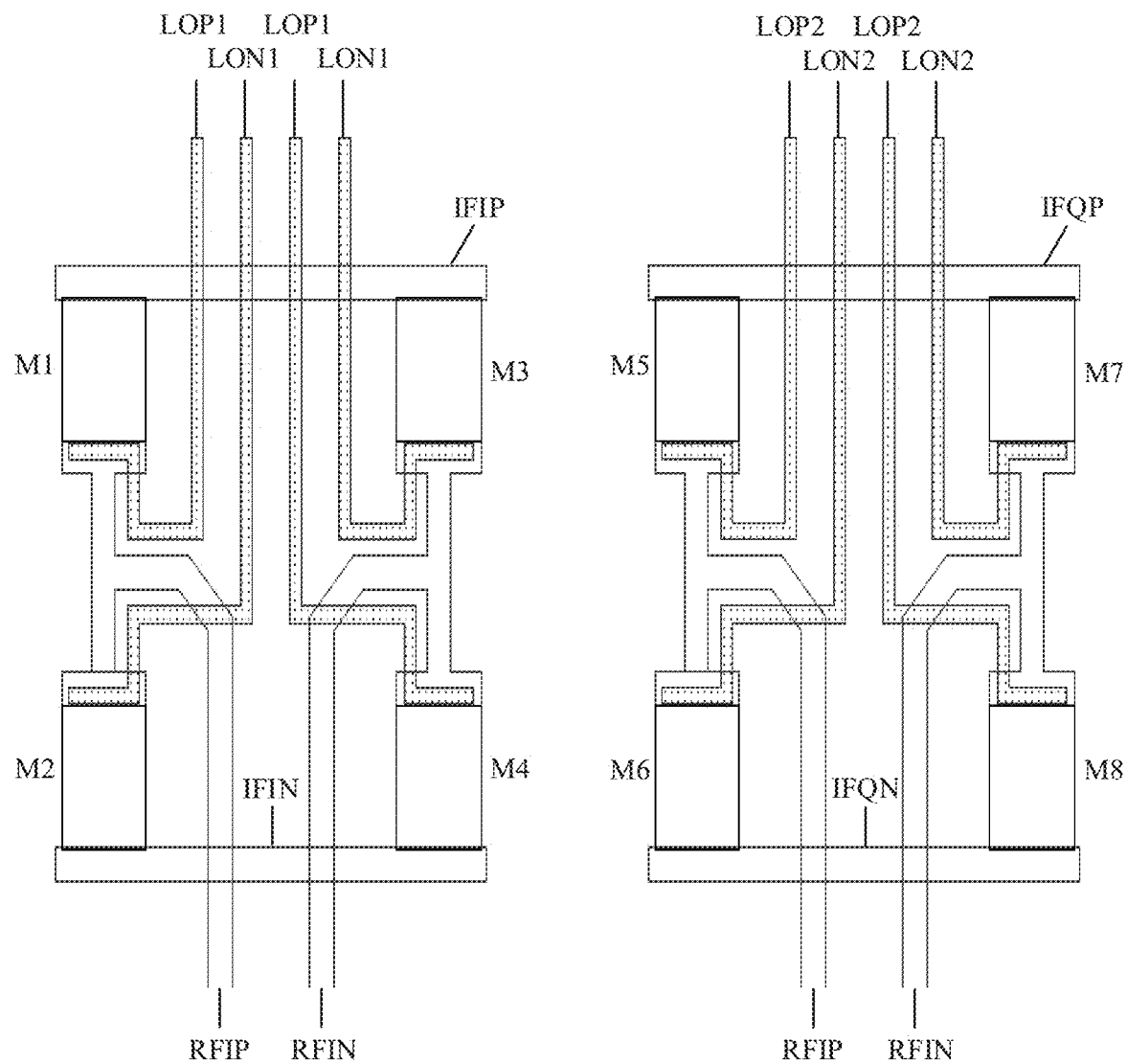
FIG. 3 shows a layout structure of a conventional mixer.
Figure 4:
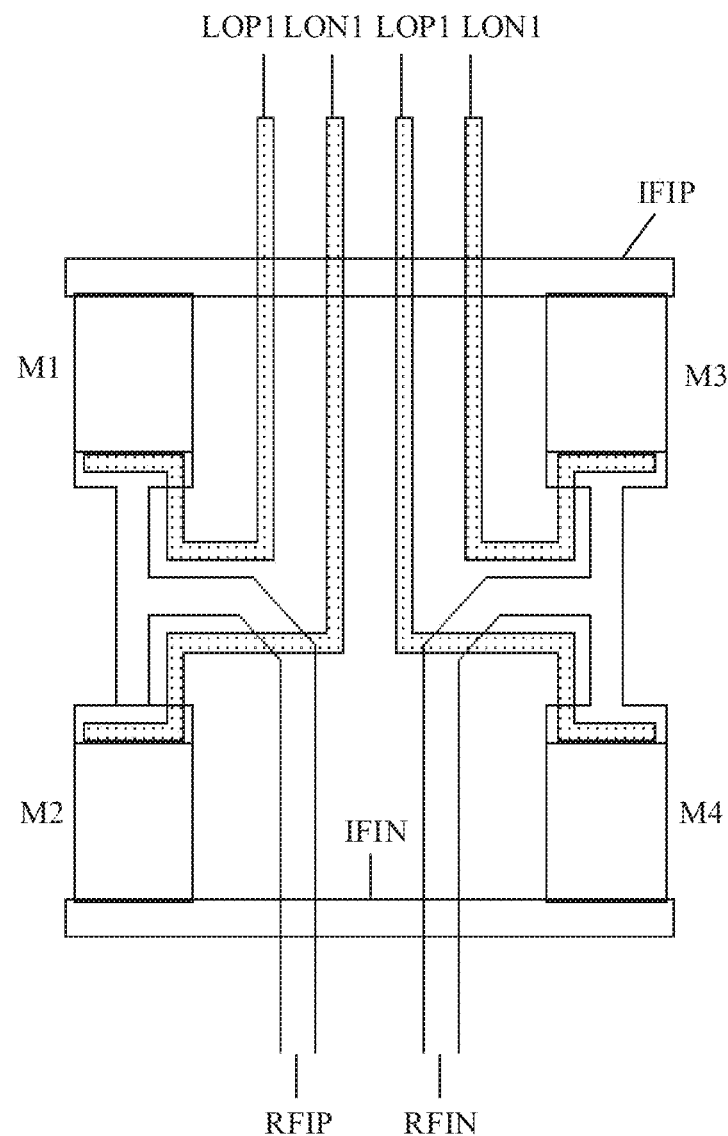
FIG. 4 shows a layout structure of one group of switch circuits in a mixer.
Figure 5:
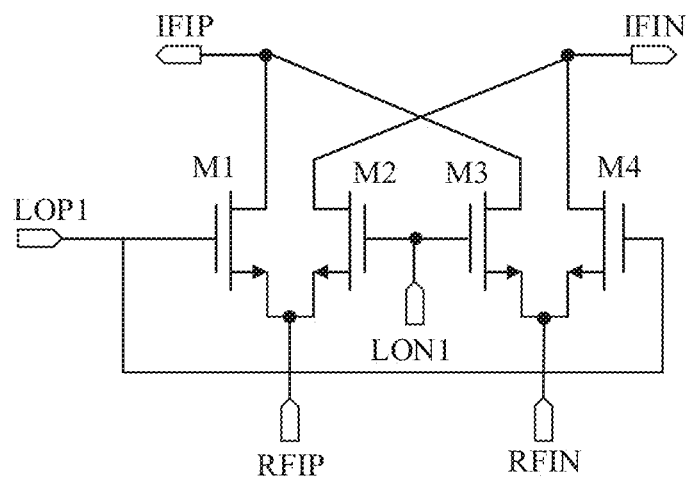
FIG. 5 is a diagram of a circuit principle of a switch circuit.

A layout structure of the mixer includes two symmetrically arranged groups of switching circuits. The gates of the four MOS transistors in each group of switching circuits each are connected to one lead. Two gate leads are connected to one output port of an LO, and the other two gate leads are connected to the other output port of the LO. FIG. 3 shows a layout structure of a conventional mixer. As shown in FIG. 3, M1 to M8 respectively correspond to M1 to M8 in FIG. 2. A layout structure on the left in FIG. 3 corresponds to the switch circuit in the dashed-line box on the left in FIG. 2. A layout structure on the right in FIG. 3 corresponds to the switch circuit in the dashed-line box on the right in FIG. 2. Both a gate of M1 and a gate of M4 are connected to an input port LOP1 of an LO, both a gate of M2 and a gate of M3 are connected to an output port LON1 of the LO, both a gate of M5 and a gate of M8 are connected to an output port LOP2 of the LO, and both a gate of M6 and a gate of M7 are connected to an output port LON2 of the LO. Both a drain of M1 and a drain of M3 are connected to an output port IFIP, both a drain of M2 and a drain of M4 are connected to an output port IFIN, both a drain of M5 and a drain of M7 are connected to an output port IFQP, and both a drain of M6 and a drain of M8 are connected to an output port IFQN. Both a source of M1 and a source of M2 are connected to an input port RFIP, both a source of M3 and a source of M4 are connected to an input port RFIN, both a source of M5 and a source of M6 are connected to an input port RFIP, and both a source of M7 and a source of M8 are connected to an input port RFIN. As shown in FIG. 3, because layout structures of the two groups of switch circuits are symmetrically arranged, to more conveniently describe a layout structure of each group of switch circuits in the layout structure of the mixer, the following describes only a layout structure of one group of switch circuits. FIG. 4 shows a layout structure of one group of switch circuits in a mixer. As shown in FIG. 4, M1 to M4 respectively correspond to M1 to M4 in FIG. 2. Both a gate of M1 and a gate of M4 are connected to an input port LOP1 of an LO, and both a gate of M2 and a gate of M3 are connected to an output port LON1 of the LO. Both a drain of M1 and a drain of M3 are connected to an output port IFIP, and both a drain of M2 and a drain of M4 are connected to an output port IFIN. Both a source of M1 and a source of M2 are connected to a same input port RFIP, and a source of M3 and a source of M4 are connected to the other input port RFIN. FIG. 5 is a diagram of a circuit principle corresponding to the layout structure in FIG. 4. M1 to M4 in FIG. 5 respectively correspond to M1 to M4 in FIG. 4. Both a gate of M1 and a gate of M4 are connected to an input port LOP1, and both a gate of M2 and a gate of M3 are connected to an input port LON1. Both a source of M1 and a source of M2 are connected to an input port RFIP, and both a source of M3 and a source of M4 are connected to an input port RFIN. Output ports of a first switch circuit are IFIP and IFIN. It can be learned from FIG. 4 that, when this layout structure is used, traces of the gates of the four MOS transistors have inconsistent lengths, and consequently, parasitics of the gates of the four MOS transistors are inconsistent. In this case, trace symmetry of the MOS transistors is directly broken, and linearity of the mixer is affected. Therefore, a problem of trace asymmetry of MOS transistors in the layout structure of the conventional mixer needs to be resolved, such that parasitics of the gates of the four MOS transistors are consistent, to improve linearity of the mixer.

Figure 6:
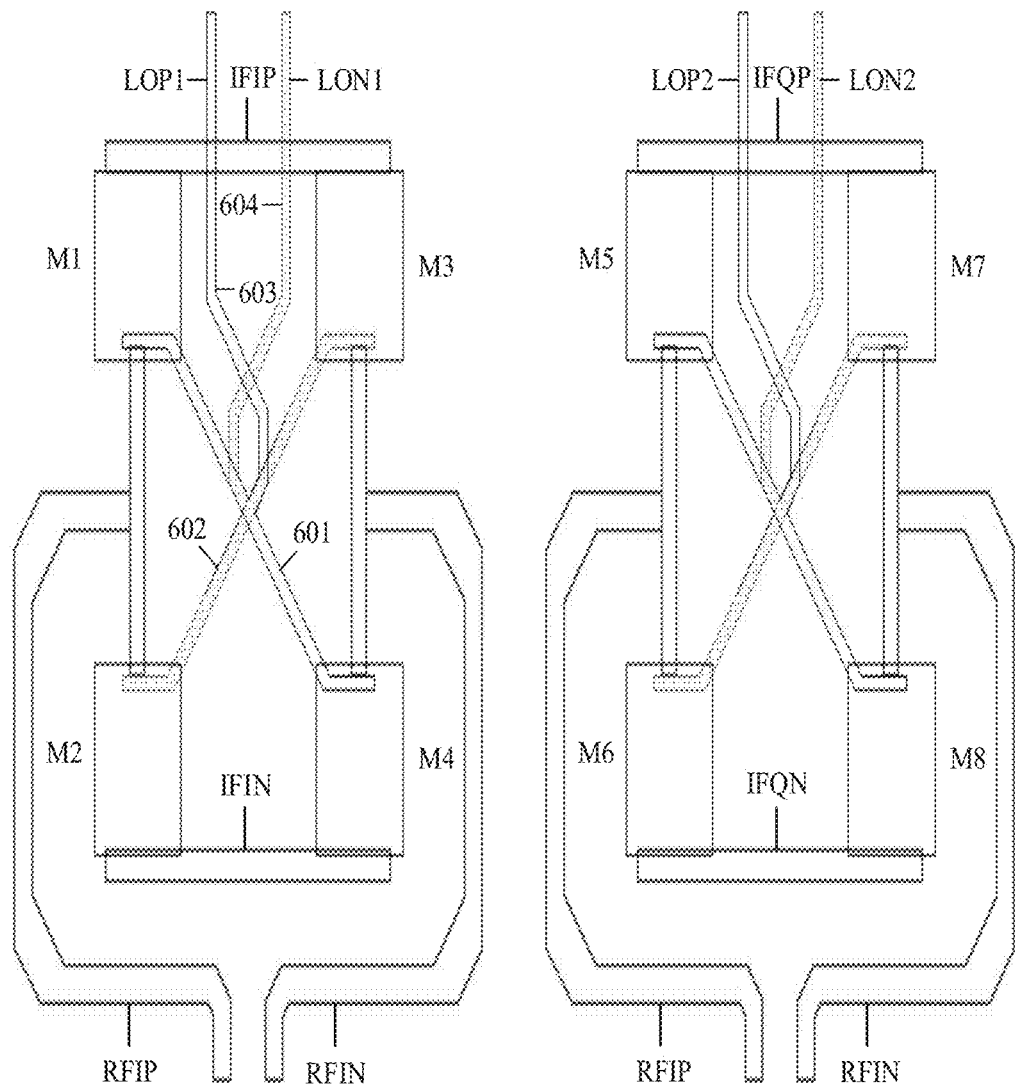
FIG. 6 shows a layout structure of a mixer according to an embodiment of this application.

The following describes a layout structure of a mixer according to an embodiment of this application. In the layout structure, parasitics of gates of MOS transistors are consistent. A diagram of a circuit principle corresponding to the layout structure of the mixer according to this application shows a mixer circuit including two groups of switch circuits. FIG. 1 shows an example of the circuit principle corresponding to the layout structure. FIG. 6 shows a layout structure of a mixer according to this application. As shown in FIG. 6, M1 to M8 respectively correspond to M1 to M8 in FIG. 2. A layout structure on the left in FIG. 6 corresponds to the first switch circuit (corresponding to a first MOS transistor group) in the dashed-line box on the left in FIG. 2. A layout structure on the right in FIG. 6 corresponds to the second switch circuit (corresponding to a second MOS transistor group) in the dashed-line box on the right in FIG. 2. A gate of M1 and a gate of M4 are directly connected through a first lead (that is, 601 in the figure), the first lead is connected to one end of a third lead (that is, 603 in the figure), and the other end of the third lead is connected to an output port LOP1 of an LO. Agate of M2 and a gate of M3 are directly connected through a second lead (that is, 602 in the figure), the second lead is connected to one end of a fourth lead (that is, 604 in the figure), and the other end of the fourth lead is connected to an output port LON1 of the LO. A gate of M5 and a gate of M8 are directly connected through a lead, and the lead is connected to an output port LOP2 of the LO through another lead. A gate of M6 and a gate of M7 are directly connected through a lead, and the lead is connected to an output port LON2 of the LO through another lead. Both a drain of M1 and a drain of M3 are connected to an output port IFIP, both a drain of M2 and a drain of M4 are connected to an output port IFIN, both a drain of M5 and a drain of M7 are connected to an output port IFQP, and both a drain of M6 and a drain of M8 are connected to an output port IFQN. Optionally, the first lead and the third lead are located at a same layer, and the second lead and the fourth lead are located at a same layer. It may be understood that the left part in FIG. 6 corresponds to a first layout area of the first switch circuit (corresponding to the first MOS transistor group), and the right part in FIG. 6 corresponds to a second layout area of the second switch circuit (corresponding to the second MOS transistor group). The first layout area and the second layout area are aligned left and right and are symmetrical along a reference symmetry axis. It can be learned, by comparing FIG. 6 with FIG. 3, that a major difference between the layout structure of the mixer provided in this embodiment of this application and the layout structure of the conventional mixer lies in that traces of gates of four MOS transistors in each group of switch circuits have consistent lengths, such that parasitics of the gates of the MOS transistors are the same. In the layout structure of the mixer in FIG. 6, the first lead between the gate of M1 and the gate of M4 and the second lead between the gate of M2 and the gate of M3 are located at different layers of the layout structure. In other words, the first lead and the second lead do not intersect. In the layout structure of the mixer provided in this embodiment of this application, because layout structures of the two groups of switch transistors are symmetrical, to more conveniently describe a layout structure of each group of switch circuits in the layout structure of the mixer, the following describes a layout structure of one group of switch circuits.

Figure 7:
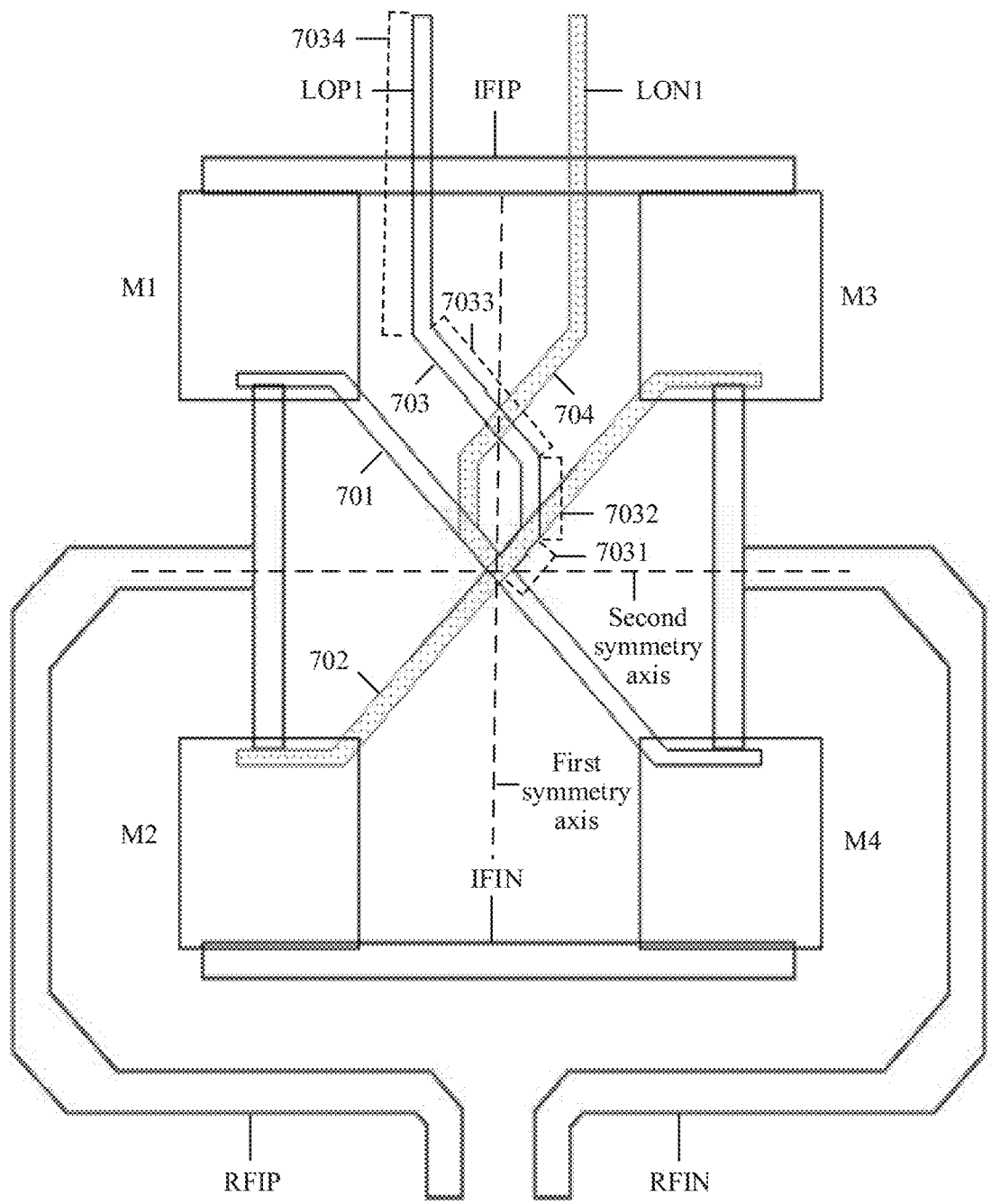
FIG. 7 shows a layout structure of a switch circuit according to an embodiment of this application.

FIG. 7 shows a layout structure of a switch circuit according to an embodiment of this application. A circuit diagram corresponding to the layout structure is shown in FIG. 5. The layout structure of the switch circuit in FIG. 7 is an example of the layout structure of the first MOS transistor group. As shown in FIG. 7, the layout structure of the switch circuit includes a first MOS transistor (that is, M1 in FIG. 7), a second MOS transistor (that is, M2 in FIG. 7), a third MOS transistor (that is, M3 in FIG. 7), and a fourth MOS transistor (that is, M4 in FIG. 7). A gate of M1 and a gate of M4 are directly connected through a first lead (that is, 701 in the figure), the first lead is connected to one end of a third lead (that is, 703 in the figure), and the other end of the third lead is connected to an input port LOP1 (corresponding to a first port) of an LO. A gate of M2 and a gate of M3 are directly connected through a second lead (that is, 702 in the figure), the second lead is connected to one end of a fourth lead (that is, 704 in the figure), and the other end of the fourth lead is connected to an output port LON1 (corresponding to a second port) of the LO. M1 and M3 are aligned left and right and are symmetrical along a first symmetry axis, M2 and M4 are aligned left and right and are symmetrical along the first symmetry axis, M1 and M2 are aligned forward and backward and are symmetrical along a second symmetry axis, and M3 and M4 are aligned forward and backward and are symmetrical along the second symmetry axis. The first symmetry axis and the second symmetry axis are perpendicular to each other. The first lead (that is, 701 in the figure) between the gate of M1 and the gate of M4 passes through a first position, the second lead (that is, 702 in the figure) between the gate of M2 and the gate of M3 passes through a second position, and the first position and the second position are same positions at different layers in the layout structure. A lead from the gate of M1 to the first position, a lead from the gate of M2 to the second position, a lead from the gate of M3 to the second position, and a lead from the gate of M4 to the first position have an equal length. One end of the third lead (that is, 703 in the figure) is connected to a third position of the first lead, and the other end of the third lead is connected to the first port (that is, the input port LOP1 in the figure). One end of the fourth lead (that is, 704 in the figure) is connected to a fourth position of the second lead, and the other end of the fourth lead is connected to the second port (that is, the input port LON1 in the figure). The third position and the fourth position are symmetrical along the first symmetry axis, and the layout structure is symmetrical along the first symmetry axis. The first lead and the second lead are located at different layers in the layout structure, and the third lead and the fourth lead are located at different layers in the layout structure. Optionally, the first position is a midpoint of the first lead, the second position is a midpoint of the second lead, and the first position, the second position, and an intersection point of the first symmetry axis and the second symmetry axis are same positions at different layers in the layout structure. Optionally, the third position is a midpoint of the first lead, the fourth position is a midpoint of the second lead, and the third position, the fourth position, and an intersection point of the first symmetry axis and the second symmetry axis are same positions at different layers in the layout structure. Optionally, the third position and the fourth position are not same positions at different layers in the layout structure. Optionally, the third position and the first position are same positions, and the fourth position and the second position are same positions. It can be learned from FIG. 7 that traces of the gates of M1 to M4 have a same length, and the third lead and the fourth lead are symmetrical along the first symmetry axis. In this way, gate parasitic capacitances of M1 to M4 are the same, and linearity of the switch circuit is relatively high.

In an optional implementation, as shown in FIG. 7, the gate of M1 and the gate of M4 are directly connected to form the first lead, the gate of M2 and the gate of M3 are directly connected to form the second lead, and both the first lead and the second lead are straight lines. In this implementation, the gate of M1 and the gate of M4 are directly connected, and the gate of M2 and the gate of M3 are directly connected. This can effectively reduce lengths of leads. Therefore, costs are relatively low.

In an optional implementation, as shown in FIG. 7, a part of the third lead (that is, 703 in the figure) is located on one side of the first symmetry axis, and the other part of the third lead is located on the other side of the first symmetry axis; a part of the fourth lead (that is, 704 in the figure) is located on one side of the first symmetry axis, and the other part of the fourth lead is located on the other side of the first symmetry axis; and the third lead passes through a fifth position, the fourth lead passes through a sixth position, and the fifth position and the sixth position are same positions at different layers in the layout structure. In this implementation, the traces of the gates of M1 to M4 are crossed twice to reach ports (that is, the input ports LOP1 and LON1) of the LO, such that the traces of the gates of M1 to M4 are strictly symmetrical. This can further improve linearity of the switch circuit.

In an optional implementation, as shown in FIG. 7, a first part (that is, 7031 in the figure) of the third lead and a part of the second lead (that is, 702 in the figure) are located in same positions at different layers in the layout structure, a second part (that is, 7032 in the figure) of the third lead is parallel to the first symmetry axis, a third part (that is, 7033 in the figure) of the third lead is located on two sides of the first symmetry axis, and a fourth part (that is, 7034 in the figure) of the third lead is parallel to the first symmetry axis; a first part (which is symmetrical with the part indicated by 7031 in the figure along the first symmetry axis) of the fourth lead and a part of the first lead are located in same positions at different layers in the layout structure, a second part (which is symmetrical with the part indicated by 7032 in the figure along the first symmetry axis) of the fourth lead is parallel to the first symmetry axis, a third part (which is symmetrical with the part indicated by 7033 in the figure along the first symmetry axis) of the fourth lead is located on the two sides of the first symmetry axis, and a fourth part (which is symmetrical with the part indicated by 7034 in the figure along the first symmetry axis) of the fourth lead is parallel to the first symmetry axis; and the third part of the third lead passes through the fifth position, and the third part of the fourth lead passes through the sixth position. Optionally, the third lead and the first lead are located at a same layer in the layout structure, and the second lead and the fourth lead are located at a same layer in the layout structure. In this implementation, the first part of the third lead and a part of the second lead are located in same positions at different layers in the layout structure, and the first part of the fourth lead and a part of the first lead are located in same positions at different layers in the layout structure. This can effectively reduce mutual impact between leads.

Figure 8:
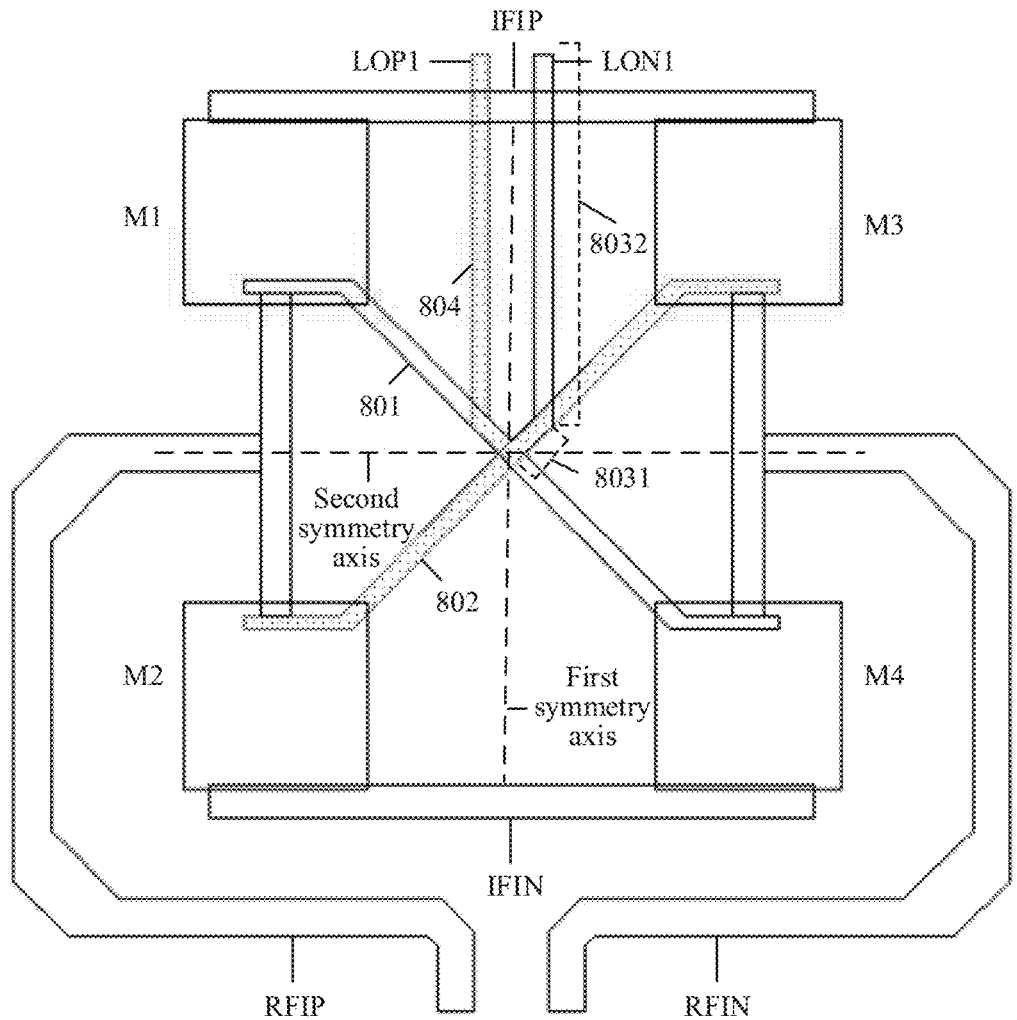
FIG. 8 shows another layout structure of a switch circuit according to an embodiment of this application.

In the layout structure in FIG. 7, the traces of the gates of M1 to M4 are crossed twice to reach the ports (that is, the input ports LOP1 and LON1) of the LO. In the layout structure of the mixer, the traces of the gates of M1 to M4 may be crossed at least once to reach the ports of the LO. Optionally, in the layout structure of the mixer, the traces of the gates of M1 to M4 may be crossed for an even quantity of times to reach the ports of the LO, such that linearity performance of the layout structure is better. In the layout structure of the switch circuit, the traces of the gates of M1 to M4 may be crossed once to reach the ports of the LO. FIG. 8 shows another layout structure of a switch circuit according to an embodiment of this application. A circuit diagram corresponding to the layout structure is shown in FIG. 5. In FIG. 8, 801 indicates a first lead, 802 indicates a second lead, 8031 indicates a first part of a third lead, 8032 indicates a second part of the first lead, and 804 indicates a fourth lead. As shown in FIG. 8, the first part (8031) of the third lead and a part of the second lead are located in same positions at different layers in the layout structure, and the second part (8032) of the third lead is parallel to a first symmetry axis; and a first part (which is symmetrical with the part 8031 along the first symmetry axis) of the fourth lead and a part of the first lead are located in same positions at different layers in the layout structure, and a second part (which is symmetrical with the part 8032 along the first symmetry axis) of the fourth lead is parallel to the first symmetry axis. Optionally, the third lead and the first lead are located at a same layer in the layout structure, and the second lead and the fourth lead are located at a same layer in the layout structure. Optionally, one end of the third lead is connected to a midpoint of the first lead, and one end of the fourth lead is connected to a midpoint of the second lead. It can be learned, by comparing FIG. 7 with FIG. 8, that a difference between the layout structure in FIG. 8 and the layout structure in FIG. 7 lies in that traces of gates of M1 to M4 may be crossed once to reach ports of an LO. In this implementation, the third lead and the fourth lead are not crossed but are directly connected to the ports of the LO. In this way, routing is simple.

Figure 9A:
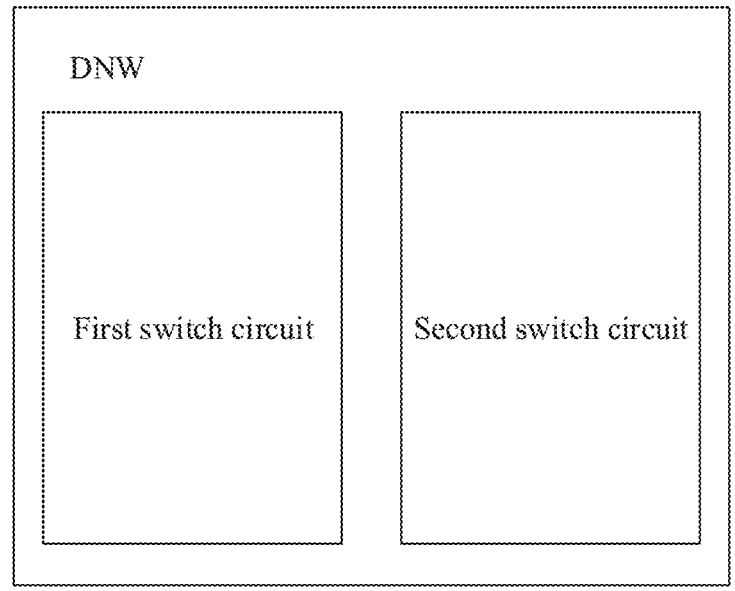
FIG. 9A shows a layout structure of a conventional mixer.

In an optional implementation, in the layout structure of the mixer, a first switch circuit and a second switch circuit are disposed on different deep N-wells (DNWs). In the layout structure of the conventional mixer, two groups of switch circuits are disposed on a same deep N-well, one group of switch circuits corresponds to a path I, the other group of switch circuits corresponds to a path Q, and isolation between the two paths I and Q is relatively poor. FIG. 9A shows a layout structure of a conventional mixer. As shown in FIG. 9A, a first switch circuit and a second switch circuit are disposed on a same deep N-well. In this case, isolation between two paths I and Q is relatively poor. FIG.

Figure 9B:
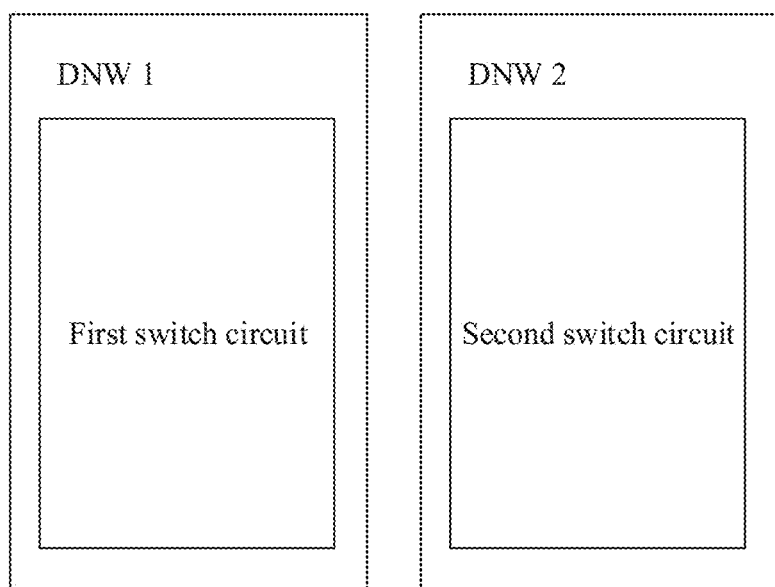
FIG. 9B shows a layout structure of a mixer according to an embodiment of this application.

9B shows a layout structure of a mixer according to an embodiment of this application. As shown in FIG. 9B, a first switch circuit is disposed on a DNW 1, and a second switch circuit is disposed on a DNW 2. In other words, the first switch circuit and the second switch circuit are disposed on different deep N-wells, so as to improve isolation between two paths I and Q. Refer to FIG. 9B. The first switch circuit and the second switch circuit in FIG. 9B are disposed on different deep N-wells. The first switch circuit corresponds to the path I, and the second switch circuit corresponds to the path Q. In this way, isolation between the two paths I and Q can be improved.

The layout structure of the switch circuit provided in this application is a layout structure with relatively good linearity performance, and is not limited to being applied to a layout structure of a mixer, but may also be applied to another circuit. In this application, equality is not limited to complete equality, but a specific deviation is allowed. An objective of the solutions in this application is to ensure that traces of gates of MOS transistors have an equal length as much as possible, but it is not limited that the traces of the gates of the MOS transistors need to have completely consistent lengths. The foregoing descriptions are merely example embodiments of this application, but are not intended to limit the protection scope of this application. Any equivalent modification or replacement readily figured out by a person skilled in the art within the technical scope disclosed in this application shall fall within the protection scope of this application. Therefore, the protection scope of this application shall be subject to the protection scope of the claims.

What is claimed is:

1. A switch circuit, comprising:
   multiple transistors including a first metal-oxide-semiconductor (MOS) transistor having a first gate, a second MOS transistor having a second gate, a third MOS transistor having a third gate, and a fourth MOS transistor having a fourth gate, wherein the first MOS transistor and the third MOS transistor are symmetrically aligned along a first symmetry axis, wherein the second MOS transistor and the fourth MOS transistor are symmetrically aligned along the first symmetry axis, wherein the first MOS transistor and the second MOS transistor are symmetrically aligned forward and backward along a second symmetry axis, wherein the third MOS transistor and the fourth MOS transistor are symmetrically aligned forward and backward along the second symmetry axis, and wherein the first symmetry axis and the second symmetry axis are perpendicular to each other;
   a first port connected to both the first gate and the fourth gate;
   a second port connected to the second gate and the third gate;
   a first lead between the first gate and the first port;
   a second lead between the second gate and the second port;
   a third lead between the third gate and the second port;
   a fourth lead between the fourth gate and the first port, wherein the first lead, the second lead, the third lead, and the fourth lead all have an equal length;
   a first direct lead between the first gate and the fourth gate passing through a first position;
   a second direct lead between the second gate and the third gate passing through a second position, wherein the first position and the second position are same positions at different layers in the switch circuit, and wherein leads from the first gate to the first position, from the second gate to the second position, from the third gate to the second position, and from the fourth gate to the first position have an equal length;
   a fifth lead comprising:
      a first end connected to a third position of the first direct lead;
      a second end connected to the first port;
      a first part located on a first side of the first symmetry axis; and
      a second part located on a second side of the first symmetry axis, wherein the first side is opposite the second side of the first symmetry axis, and wherein the fifth lead passes through a fifth position,
   a sixth lead comprising:
      a third end connected to a fourth position of the second direct lead;
      a fourth end connected to the second port, wherein the third position and the fourth position are symmetrical along the first symmetry axis, and wherein the switch circuit is symmetrical along the first symmetry axis;
      a third part located on the first side of the first symmetry axis; and
      a fourth part located on the second side of the first symmetry axis, wherein the sixth lead passes through a sixth position, and wherein the fifth position and the sixth position are same positions at different layers in the switch circuit.

2. The switch circuit according to claim 1, wherein the first gate and the fourth gate are directly connected to form the first lead, wherein the second gate and the third gate are directly connected to form the second lead, and wherein both the first lead and the second lead are straight lines.

3. The switch circuit according to claim 1, wherein the first part of the fifth lead and a fifth part of the second direct lead are located in same positions at different layers in the switch circuit, wherein the second part of the fifth lead is parallel to the first symmetry axis, wherein a ninth part of the fifth lead is located on two sides of the first symmetry axis, wherein a tenth part of the fifth lead is parallel to the first symmetry axis, wherein the third part of the sixth lead and a sixth part of the first direct lead are located in same positions at different layers in the switch circuit, wherein the fourth part of the sixth lead is parallel to the first symmetry axis, wherein seventh part of the sixth lead is located on the two sides of the first symmetry axis, wherein than eighth part of the sixth lead is parallel to the first symmetry axis, wherein the third part of the fifth lead passes through the fifth position, and wherein the seventh part of the sixth lead passes through the sixth position.

4. The switch circuit according to claim 1, wherein the fifth lead is located on the first of the first symmetry axis and the sixth lead is located on the second side of the first symmetry axis, wherein the first part of the fifth lead and a fifth part of the second direct lead are located in same positions at different layers in the switch circuit, wherein the second part of the fifth lead is parallel to the first symmetry axis, wherein the third part of the sixth lead and a sixth part of the first direct lead are located in same positions at different layers in the switch circuit, and wherein the fourth part of the sixth lead is parallel to the first symmetry axis.

5. The switch circuit according to claim 1, wherein the third position and the first position are same positions, and wherein the fourth position and the second position are same positions.

6. A mixer, comprising:
   a switch circuit including:

multiple transistors including a first metal-oxide-semiconductor (MOS) transistor having a first gate, a second MOS transistor having a second gate, a third MOS transistor having a third gate, and a fourth MOS transistor having a fourth gate, wherein the first MOS transistor and the third MOS transistor are symmetrically aligned along a first symmetry axis, wherein the second MOS transistor and the fourth MOS transistor are symmetrically aligned along the first symmetry axis, wherein the first MOS transistor and the second MOS transistor are symmetrically aligned forward and backward along a second symmetry axis, wherein the third MOS transistor and the fourth MOS transistor are symmetrically aligned forward and backward along the second symmetry axis, and wherein the first symmetry axis and the second symmetry axis are perpendicular to each other;

a first port connected to both the first gate and the fourth gate;

a second port connected to the second gate and the third gate;

a first lead between the first gate of the first MOS transistor and the first port;

a second lead between the second gate of the second MOS transistor and the second port;

a third lead between the third gate of the third MOS transistor and the second port;

a fourth lead between the fourth gate of the fourth MOS transistor and the first port, wherein the first lead, the second lead, the third lead, and the fourth lead all have an equal length;

a first direct lead between the first gate and the fourth gate passing through a first position;

a second direct lead between the second gate and the third gate passing through a second position, wherein the first position and the second position are same positions at different layers in the switch circuit, and wherein leads from the first gate to the first position, from the second gate to the second position, from the third gate to the second position, and from the fourth gate to the first position have an equal length;

a fifth lead comprising:
 a first end connected to a third position of the first direct lead;
 a second end connected to the first port;
 a first part located on a first side of the first symmetry axis; and
 a second part located on a second side of the first symmetry axis, wherein the first side is opposite the second side of the first symmetry axis, and wherein the fifth lead passes through a fifth position, a sixth lead comprising:
 a third end connected to a fourth position of the second direct lead;
 a fourth end connected to the second port, wherein the third position and the fourth position are symmetrical along the first symmetry axis, and wherein the switch circuit is symmetrical along the first symmetry axis;
 a third part located on the first side of the first symmetry axis; and
 a fourth part located on the second side of the first symmetry axis, wherein the sixth lead passes through a sixth position, and wherein the fifth position and the sixth position are same positions at different layers in the switch circuit.

7. The mixer according to claim 6, wherein the first port and the second port are both local oscillator ports for receiving a drive voltage, wherein a first source of the first MOS transistor and a second source of the second MOS transistor are both connected to a first input port, wherein a third source of the third MOS transistor and a fourth source of the fourth MOS transistor are both connected to a second input port, wherein a first drain of the first MOS transistor and a third drain of the third MOS transistor are both connected to a first output port, and wherein a second drain of the second MOS transistor and a fourth drain of the fourth MOS transistor are connected to a second output port.

8. The mixer according to claim 7, further comprising:
a low-noise amplifier connected to both the first input port and the second input port; and
a transimpedance amplifier connected to both the first output port and the second output port.

9. A mixer, comprising:
a first metal-oxide-semiconductor (MOS) transistor group including a circuit structure, a first MOS transistor having a first gate, a second MOS transistor having a second gate, a third MOS transistor having a third gate, and a fourth MOS transistor having a fourth gate, wherein the first MOS transistor and the third MOS transistor are symmetrically aligned along a first symmetry axis, wherein the second MOS transistor and the fourth MOS transistor are symmetrically aligned along the first symmetry axis, wherein the first MOS transistor and the second MOS transistor are symmetrically aligned forward and backward along a second symmetry axis, wherein the third MOS transistor and the fourth MOS transistor are symmetrically aligned forward and backward along the second symmetry axis, and wherein the first symmetry axis and the second symmetry axis are perpendicular to each other;
a second MOS transistor group including a same circuit structure as the circuit structure of the first MOS transistor group, wherein the first MOS transistor group and the second MOS transistor group are symmetrically aligned along a reference symmetry axis;
a first local oscillator port connected to the first gate and the fourth gate;
a second local oscillator port connected to the second gate and the third gate; and
a first lead between the first gate and the first local oscillator port;
a second lead between the second gate and the second local oscillator port;
a third lead between the third gate and the second local oscillator port; and
a fourth lead between the fourth gate and the first local oscillator port,
wherein the first lead, the second lead, the third lead, and the fourth lead all have an equal length;
a first direct lead between the first gate and the fourth gate passing through a first position;
a second direct lead between the second gate and the third gate passing through a second position, wherein the first position and the second position are same positions at different layers in the mixer, and wherein leads from the first gate to the first position, from the second gate to the second position, from the third gate to the second position, and from the fourth gate to the first position have an equal length;
a fifth lead comprising:

a first end connected to a third position of the first direct lead;
a second end connected to the first local oscillator port;
a first part located on a first side of the first symmetry axis; and
a second part located on a second side of the first symmetry axis, wherein the first side is opposite the second side of the first symmetry axis, and wherein the fifth lead passes through a fifth position,
a sixth lead comprising:
a third end connected to a fourth position of the second direct lead;
a fourth end connected to the second local oscillator port, wherein the third position and the fourth position are symmetrical along the first symmetry axis, and wherein the mixer is symmetrical along the first symmetry axis;
a third part located on the first side of the first symmetry axis; and
a fourth part located on the second side of the first symmetry axis, wherein the sixth lead passes through a sixth position, and wherein the fifth position and the sixth position are same positions at different layers in the mixer.

10. The mixer according to claim 9, wherein the first MOS transistor group and the second MOS transistor group are disposed on different deep N-wells.

11. The mixer according to claim 9, further comprising a low-noise amplifier connected to both a first input port and a second input port.

12. The mixer according to claim 11, further comprising a transimpedance amplifier connected to both a first output port and a second output port.

13. The mixer according to claim 9, wherein at least one of the first local oscillator port or the second local oscillator port is for receiving a drive voltage.

14. The mixer according to claim 9, wherein the first gate and the fourth gate are directly connected to form the first lead, and wherein the second gate and the third gate are directly connected to form the second lead.

15. An electronic device, comprising:
a mixer including:
a first metal-oxide-semiconductor (MOS) transistor group including a circuit structure, a first MOS transistor having a first gate, a second MOS transistor having a second gate, a third MOS transistor having a third gate, and a fourth MOS transistor having a fourth gate, wherein the first MOS transistor and the third MOS transistor are symmetrically aligned along a first symmetry axis, wherein the second MOS transistor and the fourth MOS transistor are symmetrically aligned along the first symmetry axis, wherein the first MOS transistor and the second MOS transistor are symmetrically aligned forward and backward along a second symmetry axis, wherein the third MOS transistor and the fourth MOS transistor are symmetrically aligned forward and backward along the second symmetry axis, and wherein the first symmetry axis and the second symmetry axis are perpendicular to each other;
a second MOS transistor group including a same circuit structure as the circuit structure of the first MOS transistor group, wherein the first MOS transistor group and the second MOS transistor group are symmetrically aligned along a reference symmetry axis;
a first local oscillator port connected to both the first gate and the fourth gate;
a second local oscillator port connected to both the second gate and the third gate;
a first lead between the first gate and the first local oscillator port;
a second lead between the second gate and the second local oscillator port;
a third lead between the third gate and the second local oscillator port;
a fourth lead between the fourth gate and the first local oscillator port,
wherein the first lead, the second lead, the third lead, and the fourth lead all have an equal length;
a first direct lead between the first gate and the fourth gate passing through a first position;
a second direct lead between the second gate and the third gate passing through a second position, wherein the first position and the second position are same positions at different layers in the mixer, and wherein leads from the first gate to the first position, from the second gate to the second position, from the third gate to the second position, and from the fourth gate to the first position have an equal length;
a fifth lead comprising:
a first end connected to a third position of the first direct lead;
a second end connected to the first local oscillator port;
a first part located on a first side of the first symmetry axis; and
a second part located on a second side of the first symmetry axis, wherein the first side is opposite the second side of the first symmetry axis, and wherein the fifth lead passes through a fifth position,
a sixth lead comprising:
a third end connected to a fourth position of the second direct lead;
a fourth end connected to the second local oscillator port, wherein the third position and the fourth position are symmetrical along the first symmetry axis, and wherein the mixer is symmetrical along the first symmetry axis;
a third part located on the first side of the first symmetry axis; and
a fourth part located on the second side of the first symmetry axis, wherein the sixth lead passes through a sixth position, and wherein the fifth position and the sixth position are same positions at different layers in the mixer.

16. The electronic device according to claim 15, wherein the first MOS transistor group and the second MOS transistor group are disposed on different deep N-wells.

17. The electronic device according to claim 15, further comprising a low-noise amplifier connected to both a first input port and a second input port.

18. The electronic device according to claim 17, further comprising a transimpedance amplifier connected to both a first output port and a second output port.

19. The electronic device according to claim 15, wherein at least one of the first local oscillator port or the second local oscillator port is for receiving a drive voltage.

20. The electronic device according to claim 15, wherein the first gate and the fourth gate are directly connected to form the first lead, and wherein the second gate and the third gate are directly connected to form the second lead.

* * * * *